US006924532B2

United States Patent
Pfirsch et al.

(10) Patent No.: US 6,924,532 B2
(45) Date of Patent: Aug. 2, 2005

(54) FIELD-EFFECT POWER TRANSISTOR

(75) Inventors: Frank Pfirsch, München (DE); Markus Zundel, Taufkirchen (DE)

(73) Assignee: Infineon Technologies AG, München (DE)

( * ) Notice: Subject to any disclaimer, the term of this patent is extended or adjusted under 35 U.S.C. 154(b) by 22 days.

(21) Appl. No.: 10/681,437

(22) Filed: Oct. 8, 2003

(65) Prior Publication Data

US 2004/0113179 A1 Jun. 17, 2004

(30) Foreign Application Priority Data

Oct. 9, 2002 (DE) .......................................... 102 46 960

(51) Int. Cl.⁷ ............................................. H01L 29/76
(52) U.S. Cl. ........................ 257/341; 257/355; 257/360; 257/363; 257/401
(58) Field of Search ................................ 257/341, 355, 257/360, 363, 368, 379, 401, 532, 536, 603

(56) References Cited

U.S. PATENT DOCUMENTS

2004/0113179 A1 * 6/2004 Pfirsch et al. ............... 257/213

* cited by examiner

*Primary Examiner*—Mark V. Prenty
(74) *Attorney, Agent, or Firm*—Jenkins, Wilson & Taylor, P.A.

(57) ABSTRACT

The present invention provides a field-effect power transistor having a first semiconductor region (10) with first channels (20) having a large ratio of a channel width (w) to a channel length (l) for conducting through an electric current from a source terminal (17) to a drain terminal (11) in a manner dependent on a signal at a gate contact (10') of the first semiconductor region (10); at least one second semiconductor region (12) with second channels (22) having a small ratio of the channel width (w) to the channel length (l) for conducting through an electric current from the source terminal (17) to the drain terminal (11) in a manner dependent on a signal at the gate contact (12') of the second semiconductor region (12); and a drive terminal (16) for providing a drive signal at the gate contacts (10'; 12'), a first predetermined resistor (14) in each case being provided between the gate contact (12') of the at least second semiconductor region (12) and the drive terminal (16); and an overvoltage protection device (13) being provided at least between the gate contact (12') of the second semiconductor region (12) and the drain terminal (11), for the purpose of switching on the second semiconductor region (12) if the voltage between them exceeds a predetermined value.

18 Claims, 3 Drawing Sheets

FIELD-EFFECT POWER TRANSISTOR

TECHNICAL FIELD

The present invention relates to a field-effect power transistor, and in particular to a field-effect power transistor for automotive applications.

BACKGROUND ART

Although the present invention is described below with regard to a motor vehicle application, it can be applied, in principle, to any field of use of power semiconductors. In the development of new generations of power transistors, for example in DMOS technology, great value is placed on reducing the on resistivity $R_{ON} \cdot A$. As a result of this, the ratio of the channel width w to the area of the DMOS structure is continually increased with the aid of shrinks. It follows from this that, given a channel length l kept predominantly constant, the ratio of the channel width w to the channel length l also increases significantly per unit area.

In automotive applications, in particular, the so-called load dump case plays an important part in the specification of the component requirements. Said load dump occurs when the connection to the automobile battery fails in the motor vehicle. The charging current provided by the generator continues to flow for a certain time and has to be absorbed or taken up by the automobile electronics until a control responds and switches off the charging current from the generator of the motor vehicle. In this time, however, a load current stabilized to a typical current density of, for example, 50 A/cm$^2$ by means of load resistors flows away via a switching device or a transistor, illustrated in FIG. 4. To that end, the transistor is preferably provided with a zener diode 13 between the gate terminal 16 and the drain terminal 11. In accordance with FIG. 4, in a load dump case, a generator (not illustrated) firstly builds up a high reverse voltage at the transistor, the built-in zener diode 13 becoming electrically conductive when its zener voltage is exceeded, so that a further increase in the reverse voltage activates the gate 16, i.e. current can flow through the transistor from the source 17 to the drain 11 or vice-versa, depending on the conduction type of the semiconductor switching device.

This current driven by the generator has to be carried by the transistor at high voltage U (e.g. 40 V) for some time (e.g. about 100 ms) and greatly heats said transistor in the process. A homogeneous distribution of the current in the semiconductor material of the transistor turns out to be advantageous in this case. However, primarily MOS transistors with a large ratio between the channel width w and the channel length l per unit area exhibit the tendency toward splitting, i.e. the current is only accepted in a few individual regions of the channel width w present, the remaining regions of the semiconductor material outputting the current, which results in local self-heating. The fact of whether or not splitting of the current or the formation of so-called hot spots in the semiconductor material occurs essentially depends on the thermal resistance, the applied drain-source voltage and the current density at the temperature-stable point. If the condition for splitting is set at $R_{th} \cdot U \cdot j_0 > 3 \cdot T_0$, the area-specific thermal resistance $R_{th}$ and the voltage U determined by the zener voltage being defined and the current density $j_0$ essentially resulting from the ratio of the channel width w to the channel length l and $T_0$ specifying the heat sink temperature (absolute temperature scale), then a large ratio of the channel width w to the channel length l results in a large $j_0$ and hence the fulfilling of the condition for splitting.

Such splitting then leads to a further large local temperature increase in the few individual semiconductor regions, if appropriate up to melting and thus destruction of the transistor. Consequently, it is problematic to provide a large ratio of the channel width w to the channel length l per unit area for the purpose of realizing a low on resistivity $R_{ON} \cdot A$ in a transistor which at the same time is intended to have a good load dump strength. In the case of trench transistors, in particular, it is possible to realize very high channel width to channel length ratios per unit area, with the result that current splitting can occur to an intensified extent in such a case.

U.S. Pat. No. 5,095,343 describes a vertically diffused power MOSFET structure with an improved safe operating area (SOA), in which, by cutting out the source regions in part of the body region, the channel width is reduced and the robustness of the components is thus increased.

The published American patent application US 2002/0020873 describes a MOSFET device having an asymmetrical MOS channel for providing different gate threshold voltage characteristics in different sections of the device. In this case, a device with different MOS channel threshold voltages in different sections of the transistor was provided in order to increase the component strength (electrical) even in the case of the application of transistors in linear amplifiers.

However, both solutions lead to an increased on resistance of the transistor in comparison with a conventional transistor with the same threshold voltage.

The German patent specification DE 100 01 876 describes a power transistor with an overvoltage protection circuit for avoiding a current path from the active zenering (zener diode between drain and gate of a semiconductor section) to the gate driving, the device having two transistors. What is problematic with this solution approach is that only one of the transistors contributes to the current flow during normal operation and a non-minimum on resistance is thus ensured. Furthermore, the gate which lies lies [sic] with the active zenering (zener diode between gate and drain terminals of the transistor) at a non-defined potential which is established by reverse currents and capacitive couplings, which results in a behavior that is difficult to control, for example on account of a temperature increase or rapid changes in the drain-source voltage.

SUMMARY OF THE INVENTION

It is an object of the present invention to provide a field-effect power transistor which has a low on resistivity and at the same time provides a high electrical strength in particular for a load dump case.

According to the invention, this object is achieved by means of the field-effect power transistor specified in claim 1.

The idea on which the present invention is based essentially consists in providing two or more regions on a chip or a semiconductor device which have ratios between channel width and channel length that differ by factors, said regions being electrically linked to a gate terminal via different predetermined resistors $R_i$.

According to the present invention, the problem mentioned above is solved in particular by virtue of the fact that a field-effect power transistor has a first semiconductor region with first MOS channel regions having a large ratio of a channel width to a channel length for conducting through an electric current from a source terminal to a drain terminal in a manner dependent on a drive signal at a gate contact of the first semiconductor region; at least one second semiconductor region with second MOS channel regions having a small ratio of the channel width to the channel length for conducting through an electric current from the source terminal to the drain terminal in a manner dependent on a drive signal at a gate contact of the second semiconductor region [lacuna] a drive terminal for providing a drive signal at the gate contacts, a first predetermined resistor in each case being provided between the gate contact of the at least second semiconductor region and the drive terminal; and an overvoltage protection device being provided at least between the gate contact of the second semiconductor region and the drain terminal, said device switching on the second semiconductor region if the voltage between the gate contact of the second semiconductor region and the drain terminal exceeds a predetermined value.

Advantageous developments and improvements of the subject matter of the invention may be found in the subclaims.

In accordance with one preferred development, the first semiconductor region and the second semiconductor region intermesh, preferably in finger-like fashion. This results in an enlarged interspace, for example a silicon interspace, between the individual MOS channel regions of the second region, as a result of which a better heat distribution or heat absorption occurs especially in the load dump case.

In accordance with a further preferred development, the first semiconductor region is formed by the first MOS channels, which are connected to the gate terminal of the field-effect power transistor, and the second semiconductor region is formed by the second MOS channels, which lie between the first MOS channels and are connected to the overvoltage protection device.

In accordance with a further preferred development, the overvoltage protection device is formed by a zener diode.

In accordance with a further preferred development, the second channel regions are provided in strip-like fashion laterally not directly adjacent, preferably equidistantly. This configuration likewise serves for improved heat distribution or heat absorption and thus for reducing the risk of current splitting in the transistor.

In accordance with a further preferred development, the first and second channels are patterned in the same way and/or embodied as trenches. Simpler producibility and the possibility of a high integration density are advantageous in this case.

In accordance with a further preferred development, the trenches are embodied with a uniform oxide thickness.

In accordance with a further preferred development, the trenches are embodied as field plate trenches.

In accordance with a further preferred development, the first predetermined resistor is embodied between the two gate contacts as a trench poly-resistor, adjustable by way of the trench length, trench width and number of trenches. This enables an advantageous integration of the first predetermined resistor in the semiconductor structure using the standard production methods.

In accordance with a further preferred development, the first predetermined resistor is embodied as a semiconductor region with a predetermined dopant concentration. In this way, the resistor may likewise be integrated in the semiconductor production process on the semiconductor device.

In accordance with a further preferred development, the value of the first predetermined resistor lies in the range between 0.2 and 2 times the value of the gate resistor, preferably between half the value of said gate resistor and the value of said gate resistor.

In accordance with a further preferred development, a second predetermined resistor is provided between the gate terminal and the gate contact of the first semiconductor region. This advantageously ensures the simultaneous operation of both regions in a normal switching operation.

In accordance with a further preferred development, the second predetermined resistor is dimensioned in a manner dependent on the first predetermined resistor and the gate capacitances of the respectively adjoining gate contacts. This affords the advantage of avoiding a relatively high loading on a semiconductor region in particular during switch-off.

In accordance with a further preferred development, the second predetermined resistor is dimensioned in such a way that the product of the first predetermined resistor and the gate capacitance of the adjoining gate contact is equal to the product of the second predetermined resistor and the gate capacitance of the adjoining gate contact. This results, for both parts, in identical time constants and thus a simultaneous switch-off, so that both transistor regions are driven simultaneously.

Exemplary embodiments of the invention are illustrated in the drawings and are explained in more detail in the description below.

DETAILED DESCRIPTION OF THE INVENTION

In the figures, identical reference symbols designate identical or functionally identical constituent parts.

Figure 1:
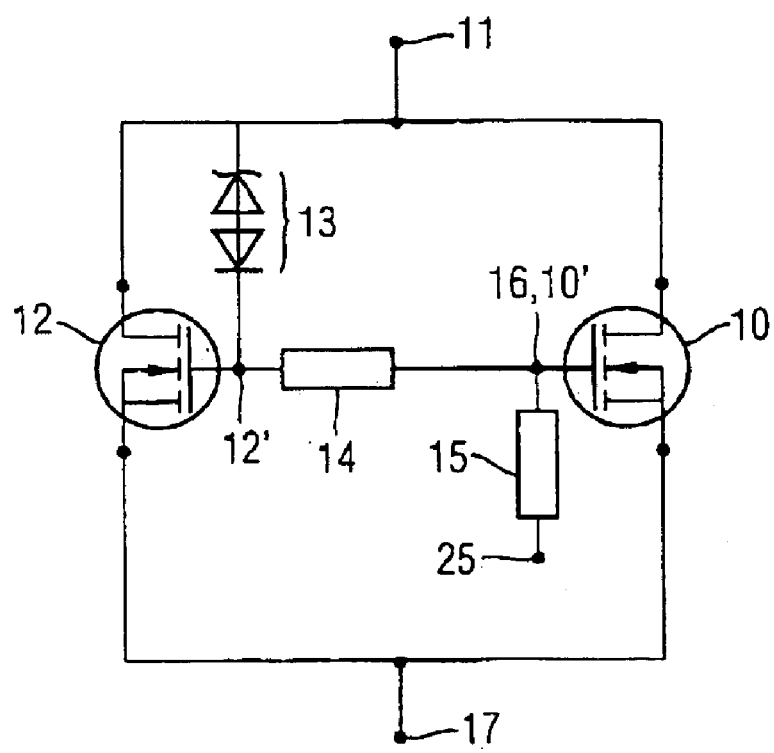
FIG. 1 shows a schematic circuit for elucidating a first embodiment of the present invention.

FIG. 1 shows a schematic circuit for elucidating a first embodiment of the present invention.

FIG. 1 illustrates a power semiconductor device having a first region 10 of a field-effect transistor device with a large ratio of a channel width w to a channel length l per unit area of the field-effect transistor device. On the drain side, the first region 10 is connected to a drain terminal 11 of the field-effect power transistor. Likewise connected to said drain terminal 11 on the drain side is a second region 12 with a small ratio of a channel width w to a channel length l per unit area of the field-effect transistor device (but not necessarily also per unit area of the second region 12). The gate contact 12' of said second region 12 is provided with an overvoltage protection device 13, preferably with an active zenering 13, which is connected e.g. via a zener diode to the drain terminal 11 of the field-effect power transistor.

A first predetermined resistor 14 lies between the gate terminal 16 of the field-effect transistor and the gate contact 12' of the second region 12 with a small w/l. The gate contact 10' of the first region 10 is connected directly to the gate terminal 16 of the field-effect power transistor. On the gate side, the second semiconductor region 12 is likewise connected to the gate terminal 16 of the field-effect power transistor indirectly via the first predetermined resistor 14. On the source side, both the first semiconductor region 10 with a large w/l and the second semiconductor region 12 with a small w/l are connected to a source terminal 17 of the field-effect power transistor. For the use of the field-effect transistor, the gate terminal 16 is connected to a gate voltage supply 25 (not part of the invention). This may be effected directly or by means of an external gate resistor 15 or a gate resistor 15 integrated into the field-effect transistor.

According to the present invention, the field-effect semiconductor device is constructed in such a way that the first semiconductor region 10 and the second semiconductor region 12 overlap and preferably form at least two intermeshing regions 10, 12 within a semiconductor device, the first region 10 with a large w/l ratio not being active under the load dump conditions described above, and the second semiconductor region 12 having a w/l ratio that is smaller by factors and being active even under the load dump conditions. On account of the sufficiently small ratio w/l (per unit area of the entire semiconductor component), current splitting or an excessive local temperature increase which leads to melting of the semiconductor material is not effected even under load dump conditions. To that end, the semiconductor regions 10, 12 preferably intermesh in such a way that a virtually homogeneous heating of the semiconductor component occurs in the cases in which the active zenering via the zener diode 13 responds.

In a load dump case, with the transistor initially switched off (the output of the gate voltage supply 25 is at 0 V), by way of example, a generator supplies a voltage of e.g. 42 V to the drain terminal 11 of the field-effect power transistor. The active zenering 13 takes up approximately 40 V thereof and then turns on. The remaining 2 V are then initially present at the gate contact 12' of the second semiconductor region 12, and toward the gate contact 10' of the first semiconductor region 10 lies the first predetermined resistor 14, which takes up e.g. 0.8 V of said 2 V (the remaining 1.2 V are then dropped across the gate resistor 15). Consequently, just 1.2 V are present at the gate electrodes 10' of the first semiconductor region, whereupon the channels in this region are not activated because the gate voltage there does not reach a threshold voltage of the MOS channels there of, for example, 1.5 V. Toward the second semiconductor region 12, the 2 V are obtained practically completely at the gate electrodes 12', whereupon the corresponding channels, which likewise have a threshold voltage of 1.5 V, become conductive, i.e. are activated.

The operating state of the semiconductor device during a load dump is configured in this case as if the chip has a ratio between the channel width w and the channel length l per unit area that is reduced by a factor n if the w/l ratio of the first semiconductor region 10 and the w/l ratio of the second semiconductor region 12 are in the ratio of n–1 to 1. In the abovementioned example, the first predetermined resistor 14 would preferably have the value of ⅔· of the value of the gate resistor 15. When the field-effect power transistor switches on and off normally, i.e. no load dump is present, both regions 10, 12 essentially operate in a manner virtually unimpaired by the predetermined resistor 14, provided that the latter is dimensioned to be sufficiently low.

Figure 2:
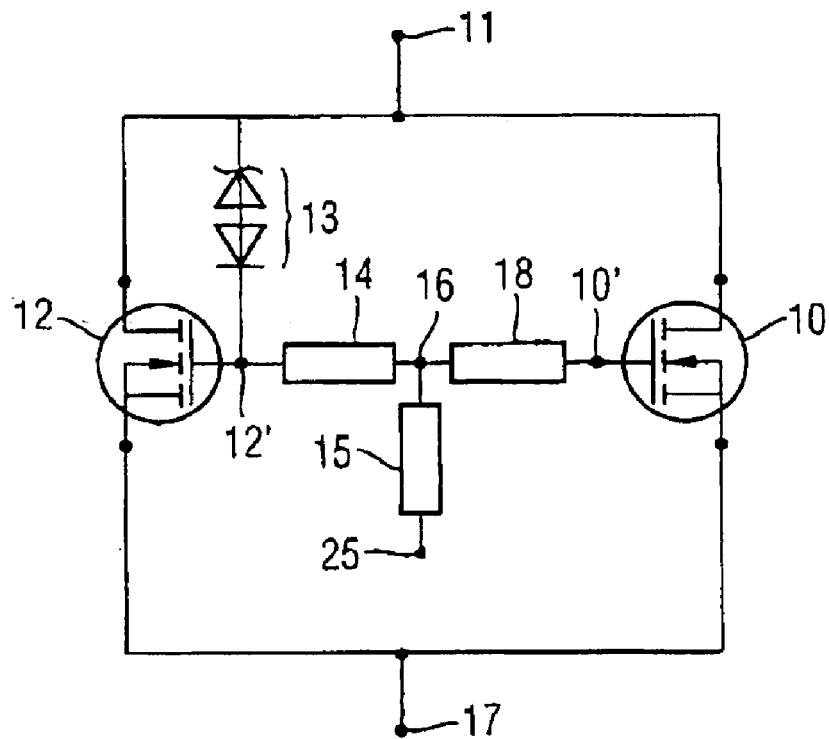
FIG. 2 shows a schematic circuit for elucidating a second embodiment of the present invention.

FIG. 2 shows a schematic circuit for elucidating a second embodiment of the present invention.

FIG. 2 illustrates a structure which largely corresponds to the arrangement elucidated with reference to FIG. 1. A first semiconductor region 10 with a gate contact 10' and a large ratio w/l is connected, on the drain side, to a drain terminal 11 of the field-effect power transistor in the same way as a second semiconductor region 12 with a gate contact 12' and a small ratio w/l. An overvoltage protection device 13, preferably an active zenering 13 e.g. with a zener diode, lies between the drain terminal 11 and the gate contact 12' of the second semiconductor region 12. In this embodiment, too, a first predetermined resistor 14 lies between the gate contact 12' of the second region and the gate terminal 16 of the field-effect power transistor. Furthermore, the gate contact 10' of the first semiconductor region 10 is connected to the gate terminal 16 of the field-effect power transistor via a second predetermined resistor 18. On the source side, both semiconductor regions 10, 12 are connected to a source terminal 17 of the field-effect power transistor.

Given suitable dimensioning of the first and second predetermined resistors 14, 18, it is possible to avoid a disadvantage which occurs in the arrangement elucidated with reference to FIG. 1, namely that, during normal switching operations), the part of the transistor with a higher gate resistance is driven more slowly and, consequently, particularly during switch-off, experiences a higher loading since a current flow for a longer time occurs there. If the two predetermined resistors 14 and 18 are chosen in such a way that both semiconductor regions are driven with identical time constants via the gate terminal 16, then both regions 10, 12 are subjected to a uniform current loading during normal operation (no load dump case). In order that identical time constants are produced, the product of the first predetermined resistor 14 and the gate capacitance at the gate terminal 12' of the second semiconductor region 12 must be equal to the product of the second predetermined resistor 18 and the gate capacitance at the gate terminal 10' of the first semiconductor region 10.

One possible dimensioning of the first predetermined resistor 14 lies in the range between 0.2 and 2 times the gate resistor 15, which has a value of e.g. about 5 Ω to 10 Ω in the case of a 25 mm² chip, for example. A value of the first predetermined resistor 14 in the range between half the value of the gate resistor 15 and the value of said gate resistor is particularly advantageous. The dimensioning for the first predetermined resistor 14 in relation to the gate resistor 15 can be effected independently of the preferred dimensioning rule for the second predetermined resistor 18.

Figure 3:
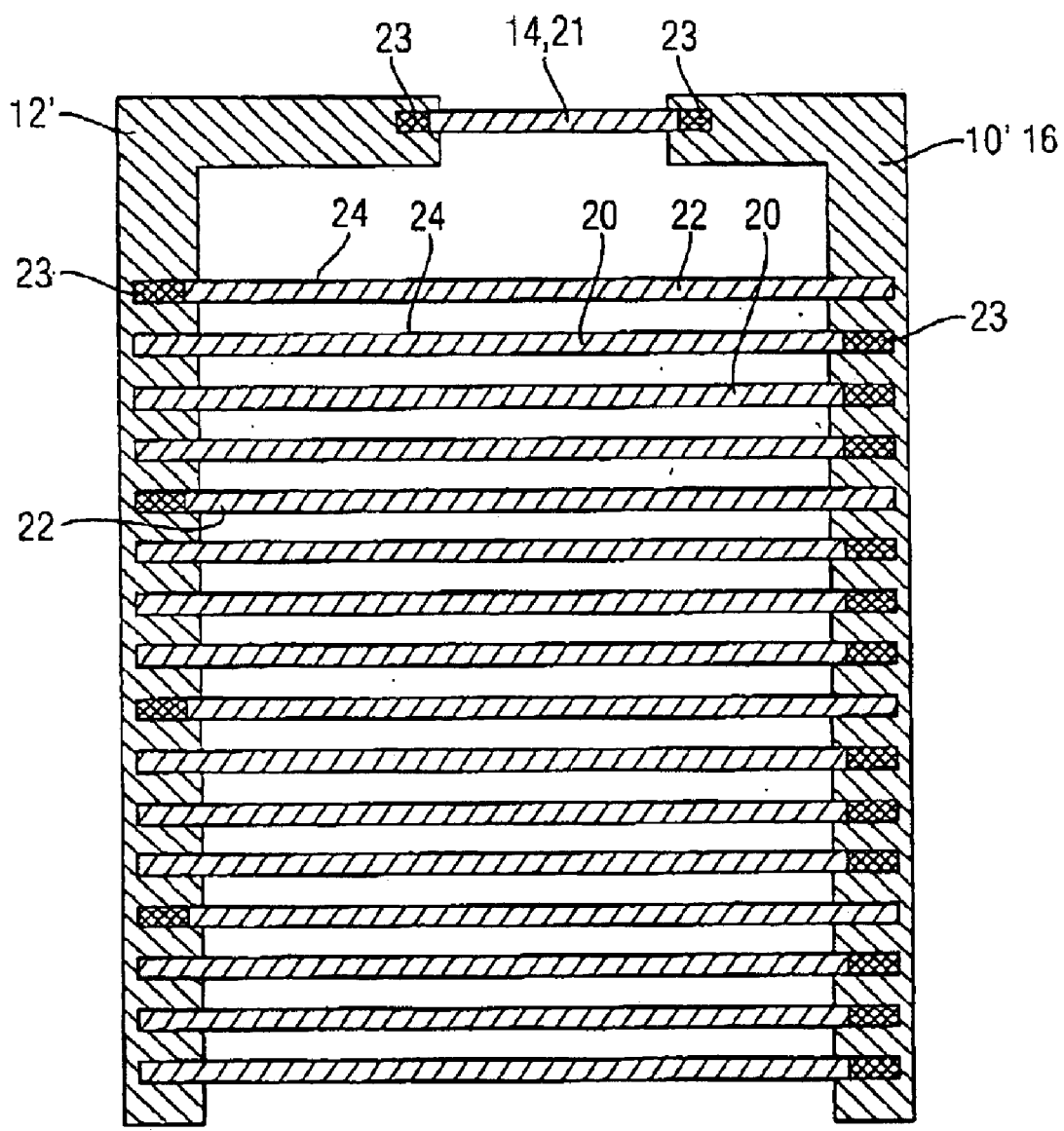
FIG. 3 shows a schematic illustration of a layout in plan view for elucidating the first embodiment of the present invention.

FIG. 3 shows a schematic layout in plan view for elucidating the first embodiment of the present invention.

FIG. 3 illustrates the layout of a detail from the arrangement elucidated with reference to FIG. 1. The first predetermined resistor 14 is provided here as a polysilicon resistor arranged in a trench 21 with plated-through holes 23 to the gate or gate metallizations of the gate terminal 16 on one side and of the gate contact 12' of the second semiconductor region 12 on the other side. First channels 20, which have a plated-through hole 23 to the gate metallization 10' of the first semiconductor region 10, are illustrated with second channels 22, which have a placed-through hole 23 to the gate metallization 12' of the second semiconductor region 12, in a strip layout with interdigitated channels 20, 22. The channels 20 and 22 and also the region 21 accommodating the resistor 14 are preferably realized as trenches of the semiconductor device, for example as a standard trench with uniform oxide thickness (thickness of the gate dielectric between the gate electrode arranged in the trench and the semiconductor body) or as a so-called field plate trench, i.e. with an oxide thickness that increases into the depth.

Figure 4:
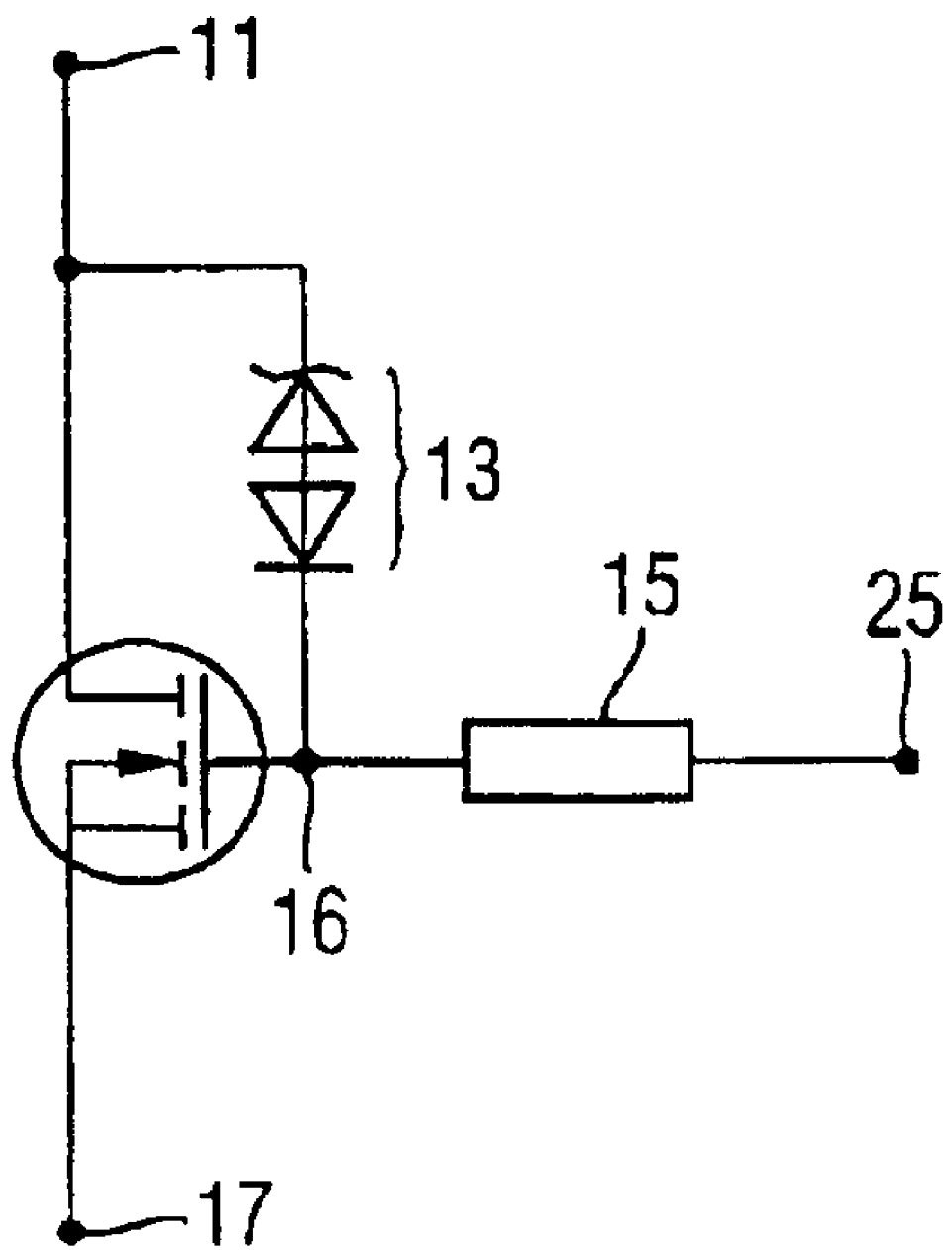
FIG. 4 shows a schematic circuit of a known power semiconductor device.

Given a configuration in the strip layout with interdigitated trenches (e.g. in such a way that two adjacent trenches 22 are in each case separated by one or more trenches 20), it follows that the section of the transistor with a small w/l ratio per unit area of the entire semiconductor component, i.e. the second semiconductor region 12, has a significantly larger silicon interspace between the trenches 22, active in the load dump case, than a transistor in accordance with FIG. 4. This leads to a significantly improved heat distribution or heat absorption by the silicon intermediate regions in a load dump case. To that end, it is advantageous if the distances between the channel regions 22 of the second semiconductor region 12, which channel regions are preferably not directly adjacent laterally equidistantly, amount in particular to no more than 20 μm in order to ensure a homogeneous heating of the chip in the load dump case, i.e. in the event of active zenering. In accordance with FIG. 3, within the trench transistor present in the strip design with the plated-through hole 23, only every n-th trench gate poly 22 is connected in a manner forming the second semiconductor region 12, whereas all the remaining trench gate polys 20 are connected via plated-through holes 23 on the other side of the chip in a manner forming the first region.

The gate terminal 16, which here coincides with the gate contact 10' of the first region 10, is connected via a suitably dimensioned resistor 14, 21 to the gate contact 12' of the second region, which is connected to the drain terminal 11 via the active zenering. In this case, the resistor 14 is embodied as a trench poly resistor 21 which is adjustable by way of the trench length, trench width and number of trenches connected in parallel. As an alternative, it may also be embodied for example as a semiconductor region with a predetermined dopant concentration. In the embodiment according to the invention in accordance with FIG. 3, a trench transistor is realized with a large channel width in the case of driving or activation by the "normal" gate terminal 16 and with a small channel width in the case of driving or activation of the gate contact 12' via the active zenering. The gate trenches 20 and 22 and also the trench 21 containing the resistor 14 are lined with a gate dielectric, preferably an oxide, and filled with polysilicon.

Although the present invention has been described above on the basis of preferred exemplary embodiments, it is not restricted thereto, but rather can be modified in diverse ways.

In particular, a different layout-technical realization in a non-strip design and, by way of example, also using a planar technology which is not trench-oriented is conceivable. Furthermore, the described realization of the first predetermined resistor is also to be regarded as by way of example.

List of Reference Symbols

10 First semiconductor region with large w/l per unit area
10' Gate contact of the first semiconductor region
11 Drain terminal of the field-effect power transistor
12 Second semiconductor region with small w/l
12' Gate contact of the second semiconductor region
13 Active zenering (zener diode)
14 First predetermined resistor
15 Gate resistor
16 Gate terminal of the field-effect power transistor
17 Source terminal of the field-effect power transistor
18 Second predetermined resistor
20 Channel of the first type
21 Polysilicon-filled trench, which forms the first predetermined resistor
22 Channel of the second type
23 Plated-through hole to gate metallization 10', 12'
24 Oxide lining of the trenches
25 Gate voltage supply
w Channel width of a controllably conducting MOS channel
l Channel length of a controllably conducting MOS channel

What is claimed is:

1. Field-effect power transistor comprising:
   (a) a first semiconductor region with first MOS channels having a first ratio of a channel width to a channel length for conducting through an electric current from a source terminal to a drain terminal in a manner dependent on a signal at a gate contact of the first semiconductor region;
   (b) at least one second semiconductor region with second MOS channels having a second ratio of the channel width to the channel length for conducting through an electric current from the source terminal to the drain terminal in a manner dependent on a signal at a gate contact of the second semiconductor region;
   (c) a drive terminal for providing a drive signal at the gate contacts, a first predetermined resistor in each case being provided between the gate contact of the at least one second semiconductor region and the drive terminal; and
   (d) an overvoltage protection device being provided at least between the gate contact of the second semiconductor region and the drain terminal, said device switching on the at least one second semiconductor region if the voltage between the gate contact of the second semiconductor region and the drain terminal exceeds a predetermined value.

2. Power semiconductor according to claim 1, wherein the second ratio of the channel width to the channel length is less than or approximately equal to the first ratio of the channel width to the channel length.

3. Power semiconductor according to claim 2, wherein the second ratio of the channel width to the channel length is at least a factor of 2 less than the first ratio of the channel width to the channel length.

4. Power semiconductor according to claim 1, wherein the first semiconductor region and the second semiconductor region intermesh in finger-like fashion.

5. Power semiconductor according to claim 1, wherein the first semiconductor region is formed by the first channels, which are connected to the drive terminal of the field-effect power transistor, and the second semiconductor region is formed by the second channels, which lie between the first channels and are connected to the overvoltage protection device.

6. Power semiconductor according to claim 1, wherein the overvoltage protection device is provided in the form of a zener diode.

7. Power semiconductor according to claim 1, wherein the second channels are provided in strip-like fashion laterally separated by first channels equidistantly.

8. Power semiconductor according to claim 1, wherein the first and second channels are patterned in the same way and/or embodied as trenches.

9. Power semiconductor according to claim 8, wherein the trenches are embodied with uniform oxide thickness.

10. Power semiconductor according to claim 8, wherein the trenches are embodied as field plate trenches.

11. Power semiconductor according to claim 1, wherein the first predetermined resistor is embodied between the two gate contacts as a polysilicon resistor.

12. Power semiconductor according to claim 1, wherein the first predetermined resistor is embodied between the two gate contacts as a trench poly-resistor, adjustable by way of the trench length, trench width and number of trenches.

13. Power semiconductor according to claim 1, wherein the first predetermined resistor is embodied as a semiconductor region with a predetermined dopant concentration.

14. Power semiconductor according to claim 1, wherein the value of the first predetermined resistor is dimensioned in a manner dependent on a gate resistor.

15. Power semiconductor according to claim 14, wherein the value of the first predetermined resistor lies in the range between 0.2 and 2 times the value of the gate resistor between half the value of said gate resistor and the value of said gate resistor.

16. Power semiconductor according to claim 1, wherein a second predetermined resistor is provided between the drive terminal and the gate contact of the first semiconductor region.

17. Power semiconductor according to claim 16, wherein the second predetermined resistor is dimensioned in a manner dependent on the first predetermined resistor and the gate capacitances of the respectively adjoining gate contacts.

18. Power semiconductor according to claim 16, wherein the second predetermined resistor is dimensioned in such a way that the product of the first predetermined resistor and the gate capacitance of the second semiconductor region is approximately equal to the product of the second predetermined resistor and the gate capacitance of the first semiconductor region.

* * * * *